(12) United States Patent
Fujimoto

(10) Patent No.: US 6,211,730 B1
(45) Date of Patent: Apr. 3, 2001

(54) PRE-AMPLIFIER CIRCUIT

(75) Inventor: Noboru Fujimoto, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/551,596

(22) Filed: Apr. 17, 2000

(30) Foreign Application Priority Data

Apr. 19, 1999 (JP) .................................. 11-110267

(51) Int. Cl.$^7$ .............................. H03F 1/14; H03F 1/08; H03F 3/45
(52) U.S. Cl. ........................... 330/51; 330/293; 330/260
(58) Field of Search ............................ 330/51, 69, 260, 330/293

(56) References Cited

U.S. PATENT DOCUMENTS

| | | | |
|---|---|---|---|
| 3,582,675 | * 6/1971 | Jordan, Jr. .................................. | 330/9 |
| 3,693,030 | * 9/1972 | Walters ................................... | 330/69 |
| 4,119,801 | * 10/1978 | Jacobson ............................... | 330/260 |
| 5,014,017 | * 5/1991 | Ishiguro et al. ......................... | 330/51 |
| 5,241,283 | * 8/1993 | Sutterlin ................................. | 330/51 |

* cited by examiner

Primary Examiner—Robert Pascal
Assistant Examiner—Patricia T. Nguyen
(74) Attorney, Agent, or Firm—Armstrong, Westerman, Hattori, McLeland & Naughton, LLP

(57) ABSTRACT

A pre-amplifier circuit comprises an operation amplifier having a noninverting input terminal connected to a voice input terminal, a negative feedback circuit having a first resistor which is connected between an output terminal of the operation amplifier and an inverting input terminal of the operation amplifier, and a second resistor and a switching element which are connected in series between the inverting input terminal of the operation amplifier and a ground, an operating switch for switching a small signal input mode and a large signal input mode, and an on-off control circuit for bringing the switching element into an off state to operate the operation amplifier as a buffer circuit when the operating switch is switched to the large signal input mode, while bringing the switching element into an on state to operate the operation amplifier as an amplifier circuit when the operating switch is switched to the small signal input mode.

5 Claims, 3 Drawing Sheets

PRE-AMPLIFIER CIRCUIT

BACKGROUND OF THE INVENTION

1. Field of the Invention

The present invention relates to pre-amplifier circuits in audio equipment.

2. Description of the Prior Art

Audio equipment having functions such as a recording function for recording on a recording medium a voice signal having a low signal level which is inputted from a microphone and a voice signal having a high signal level which is inputted from an external voice input terminal and a monitor function for reproducing and outputting the inputted voice signals has been known.

FIG. 3 illustrates a conventional pre-amplifier circuit provided in such audio equipment.

A pre-amplifier circuit comprises a voice input termina 101, a first switch 102, a buffer 103 an amplifier 104, a second switch 105, and a slide switch 106 for controlling both the switches 102 and 105. A voice signal having a low signal level from a microphone or a voice signal having a high signal level from an external voice input terminal is inputted to the voice input terminal 101.

When the voice signal having a high signal level from the external voice input terminal is inputted to the voice input terminal 101, the slide switch 106 is set at such a position that contacts 106b and 106c are connected to each other (a large signal-side position), and the first switch 102 and the second switch 105 are respectively connected to contacts 102a and 105a, as shown in FIG. 3. Consequently, the voice signal having a high signal level which has been inputted to the voice input terminal 101 is outputted through the buffer 103.

When the voice signal having a low signal level from the microphone is inputted to the voice input terminal 101, the slide switch 106 is set at such a position where the contact 106b and a contact 10a are connected to each other (a small signal-side position), and the first switch 102 and the second switch 105 are respectively connected to contacts 102b and 105b. Consequently, the voice signal having a low signal level which has been inputted to the voice input terminal 101 is amplified by the amplifier 104 and is outputted.

In the conventional pre-amplifier circuit, two signal paths, that is, a signal path including the buffer 103 and a signal path including the amplifier 104 are required. Further, in a case where the slide switch 106 is switched to the small signal-side position, when the voice signal having a high signal level is inputted, the amplifier 104 enters a hard gripped state. Accordingly, a power line greatly swings, so that noise is outputted.

SUMMARY OF THE INVENTION

An object of the present invention is to provide a pre-amplifier circuit capable of copying with input voice signals having different signal levels by only one signal path.

Another object of the present invention is to provide a pre-amplifier circuit capable of copying with input voice signals having different signal levels by only one signal path as well as reducing A first pre-amplifier circuit according to the present invention is characterized by comprising an operation amplifier having a noninverting input terminal connected to a voice input terminal;

a negative feedback circuit having a first resistor which is connected between an output terminal of the operation amplifier and an inverting input terminal of the operation amplifier, and a second resistor and a switching element which are connected in series between the inverting input terminal of the operation amplifier and a ground; an operating switch for switching a small signal input mode and a large signal input mode; and an on-off control circuit for bringing the switching element into an off state to operate the operation amplifier as a buffer circuit when the operating switch is switched to the large signal input mode, while bringing the switching element into anon state to operate the operation amplifier as an amplifier circuit when the operating switch is switched to the small signal input mode.

It is preferable that there is provided a noise generation preventing circuit for bringing the switching element into an off state when the signal level of an output signal of the operation amplifier is not less than a predetermined level.

Used as the noise generation preventing circuit is one comprising a voltage divider circuit for dividing an output voltage of the operation amplifier, a rectifier circuit for rectifying an output of the voltage divider circuit, and a control element for bringing the switching element into an off state when the output voltage of the rectifier circuit is not less than a predetermined value.

A second pre-amplifier circuit according to the present invention is characterized by comprising an operation amplifier having a noninverting input terminal connected to a voice input terminal; a negative feedback circuit having a first resistor which is connected between an output terminal of the operation amplifier and an inverting input terminal of the operation amplifier, and a second resistor and a switching element which are connected in series between the inverting input terminal of the operation amplifier and a ground; a driving circuit for always bringing the switching element into an on state to operate the operation amplifier as an amplifier circuit; and an on-off control circuit for bringing the switching element into an off state to operate the operation amplifier as a buffer circuit when the signal level of an output signal of the operation amplifier is not less than a predetermined level.

Used as the on-off control circuit is one comprising a voltage divider circuit for dividing an output voltage of the operation amplifier, a rectifier circuit for rectifying an output of the voltage divider circuit, and a control element for bringing the switching element into an off state when the output voltage of the rectifier circuit is not less than a predetermined value.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
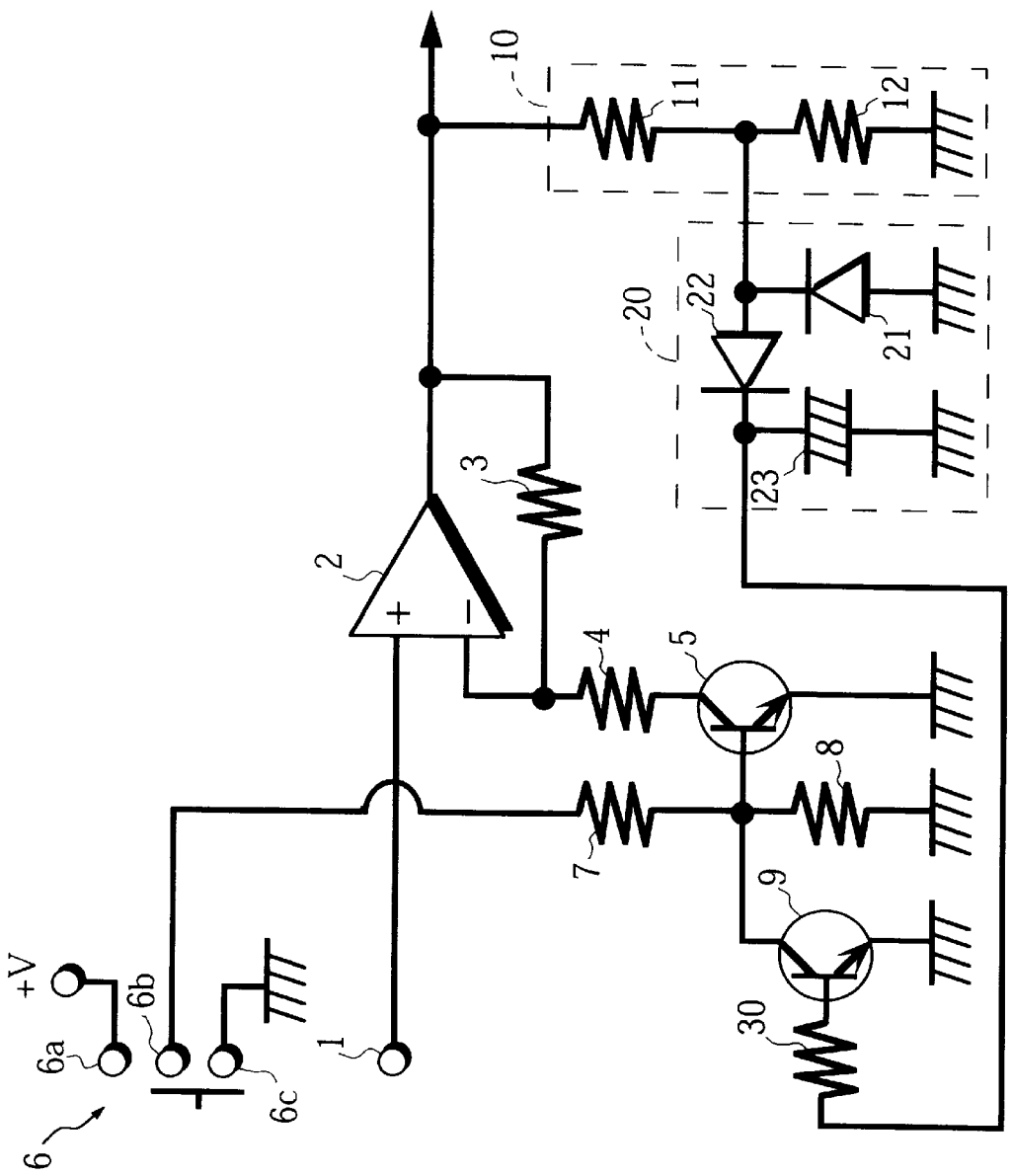
FIG. 1 is an electric circuit diagram showing the configuration of a pre-amplifier circuit.

Referring now to the drawings, an embodiment of the present invention will be described.

FIG. 1 illustrates the configuration of a pre-amplifier circuit.

A voice input terminal 1 is connected to a noninverting input terminal of an operation amplifier 2. An output terminal of the operation amplifier 2 is connected to an inverting input terminal of the operation amplifier 2 through a resistor 3. The inverting input terminal of the operation amplifier 2 is grounded through a second resistor 4 and a switching transistor 5. That is, a negative feedback is provided to the operation amplifier 2 by a negative feedback circuit comprising the resistor 3, the resistor 4, and the first switching transistor 5.

A slide switch 6 is switched to choose whether the operation amplifier 2 should be operated as a noninverting amplifier circuit or a buffer circuit depending on the signal level of a voice signal inputted to the voice input terminal 1. A contact 6a of the slide switch 6 is connected to a DC power supply. A contact 6c of the slide switch 6b is grounded. A contact 6b of the slide switch 6 is grounded through a voltage divider circuit comprising a resistor 7 and a resistor 8.

A node of the resistor 7 and the resistor 8 is connected to the base of the first switching transistor 5, and is grounded through a second switching transistor 9. An output of the operation amplifier 2 is fed to the base of the second switching transistor 9 through a voltage divider circuit 10 a rectifier circuit 20, and a resistor 30. The voltage divider circuit 10 is constituted by a resistor 11 and a resistor 12. The rectifier circuit 20 is constituted by a diode 21, a diode 22, and a capacitor 23.

When a voice signal having a high signal level from an external voice input terminal is inputted to the voice input terminal 1 (at the time of a large signal input mode) the slide switch 6 is set at such a position that the contact 6b and the contact 6c are connected to each other (a large signal-side position), as shown in FIG. 1. As a result, the first switching transistor 5 is brought into an off state, so that the operation amplifier 2 operates as a buffer circuit. Consequently, the voice signal inputted to the voice input terminal 1 is outputted through the buffer circuit comprising the operation amplifier 2 and the resistor 3.

When a voice signal having a low signal level from a microphone is inputted to the voice input terminal 1 (at the time of a small signal input mode) the slide switch 6 is set at such a position that the contact 6b and the contact 6c are connected to each other (a small signal-side position), as shown in FIG. 1. As a result, the first switching transistor 5 is brought into an on state, so that the operation amplifier 2 operates as a noninverting amplifier circuit. Consequently, the voice signal inputted to the voice input terminal 1 is outputted through the noninverting amplifier circuit comprising the operation amplifier 2, the resistor 3, the resistor 4, and the first switching transistor 5. That is, the voice signal inputted to the voice input terminal 1 is amplified and is outputted.

An output voltage of the operation amplifier 2 is divided by the voltage divider circuit 10, and an output of the voltage divider circuit 10 is then rectified by the rectifier circuit 20. A DC voltage outputted from the rectifier circuit 20 is applied to the base of the second switching transistor 9 through the resistor 30. In a case where the slide switch 6 is switched to the small signal-side position, therefore, when the voice signal having a high signal level is inputted to the voice input terminal 1, the second switching transistor 9 is brought into an on state, and the first switching transistor 5 is brought into an off state. Accordingly, the operation amplifier 2 operates as a buffer circuit.

In a case where the slide switch 6 is switched to the small signal-side position, therefore, when the voice signal having a high signal level is inputted to the voice input terminal 1, the noninverting amplifier circuit comprising the operation amplifier 2, the resistor 3, the resistor 4, and the first switching transistor 5 is prevented from being brought into a hard gripped state, thereby preventing noise from being generated.

In a case where the second switching transistor 9 is in an on state, when the signal level of the voice signal inputted to the voice input terminal 1 is lowered, the second switching transistor 9 is brought into an off state, and the first switching transistor 5 is brought into an on state. Accordingly, the operation amplifier 2 operates as a noninverting amplifier circuit again.

According to the present embodiment, input voice signals having different signal levels can be coped with by only one signal path, and noise can be reduced.

Figure 2:
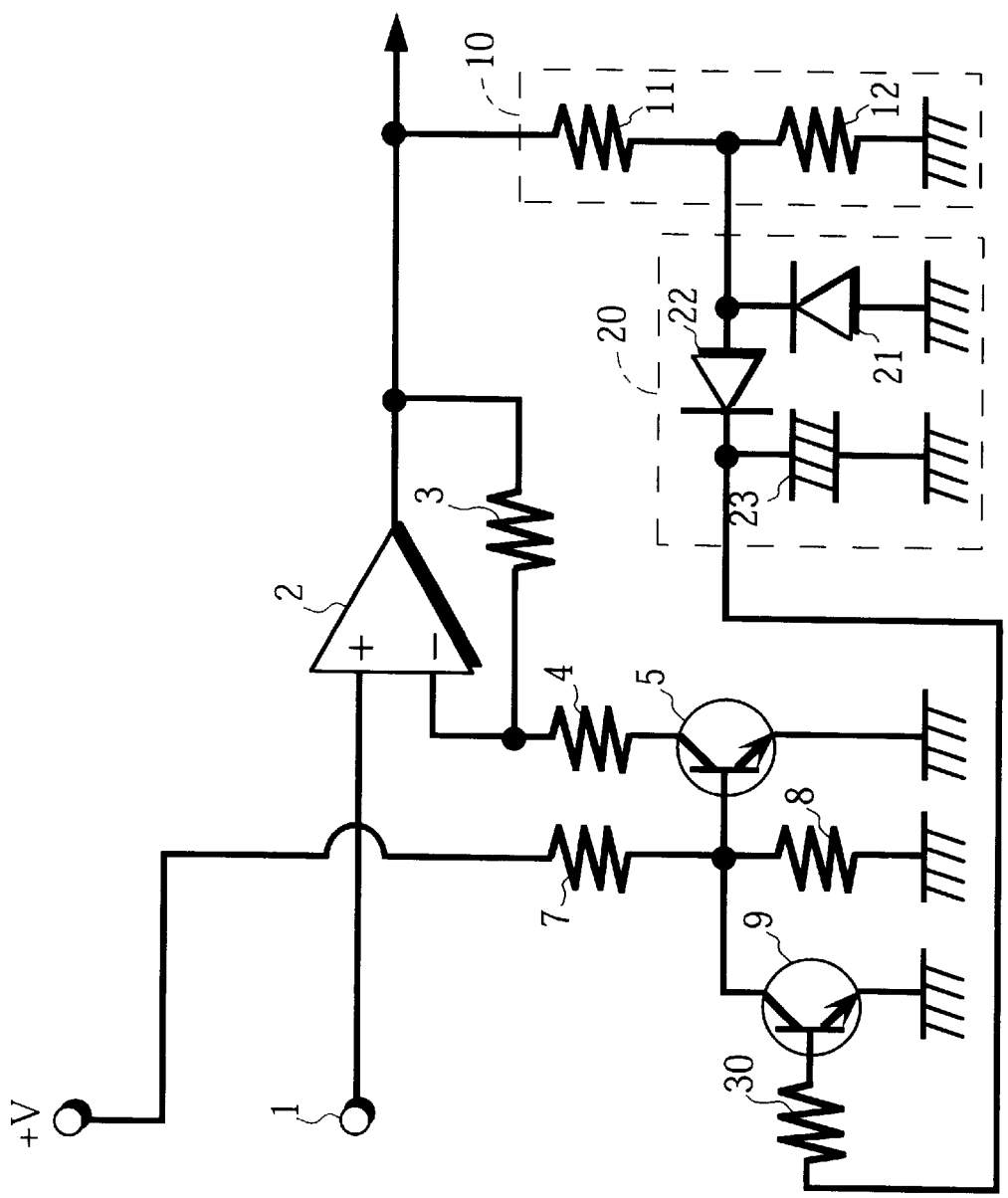
FIG. 2 is an electric circuit diagram showing a modified example of the pre-amplifier circuit.
Figure 3:
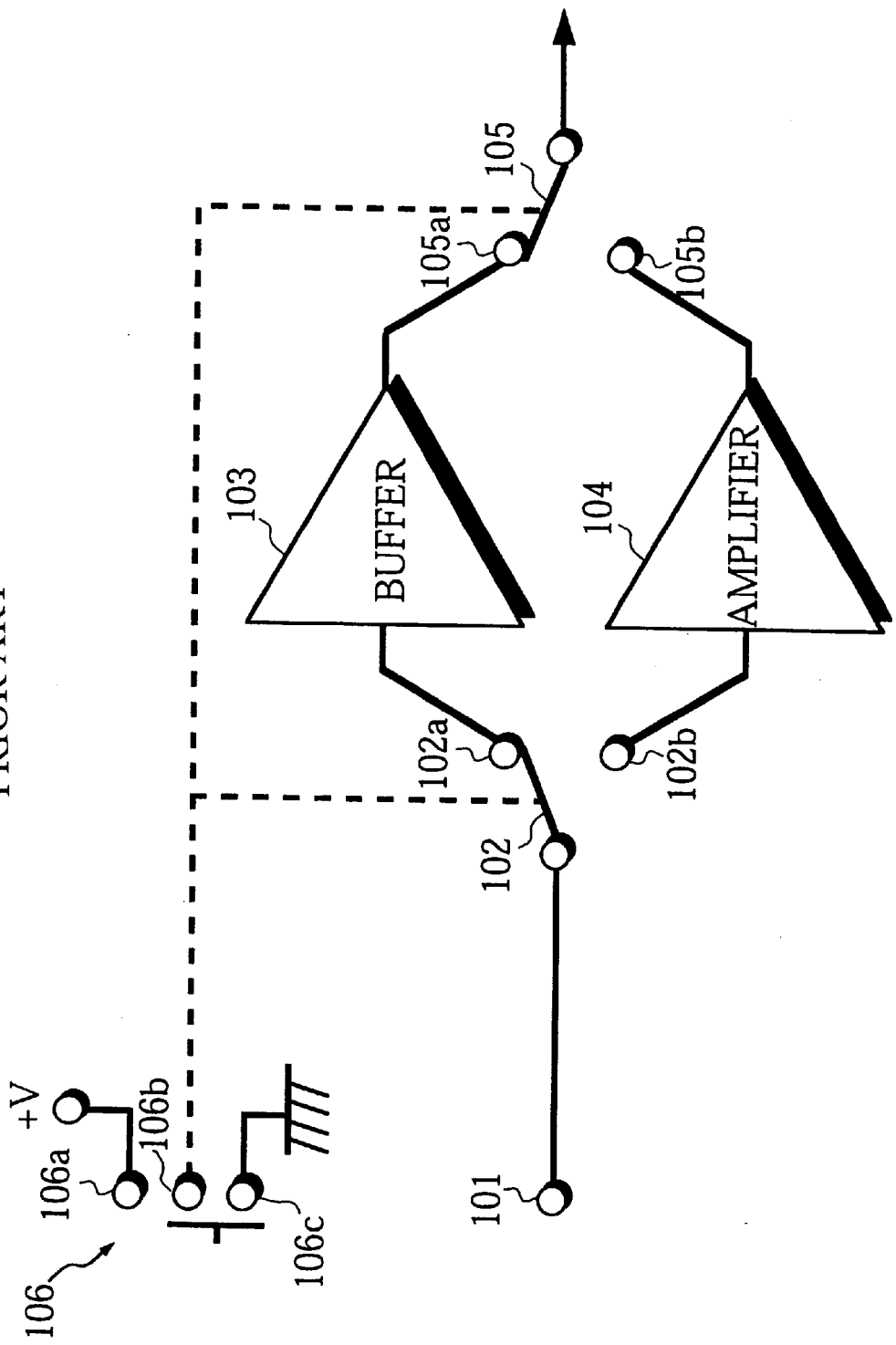
FIG. 3 is an electric circuit diagram showing the configuration of a conventional pre-amplifier circuit.

FIG. 2 illustrates a modified example of the pre-amplifier circuit. In FIG. 2, the same components as those shown in FIG. 1 are assigned the same reference numerals and hence, the description thereof is not repeated.

In the pre-amplifier circuit shown in FIG. 2, the slide switch 6 in the pre-amplifier circuit shown in FIG. 1 is not provided. A DC power supply is always connected to a voltage divider circuit comprising a resistor 7 and a resistor 8. Consequently, the operation of the pre-amplifier circuit is the same as the operation in a case where the slide switch 6 is switched to the small signal-side position in the pre-amplifier circuit shown in FIG. 1.

Specifically, an operation amplifier 2 always operates as a noninverting amplifier circuit. When the output level of the operation amplifier 2 is not less than a predetermined level, the operation amplifier 2 operates as a buffer circuit. Even if the slide switch 6 is not provided, therefore, the operation amplifier 2 can be operated as a buffer circuit in a case where a voice signal having a high signal level from an external voice input terminal is inputted to a voice input terminal 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pre-amplifier circuit comprising:

an operation amplifier having a noninverting input terminal connected to a voice input terminal;

a negative feedback circuit having a first resistor which is connected between an output terminal of the operation amplifier and an inverting input terminal of the operation amplifier, and a second resistor and a switching element which are connected in series between the inverting input terminal of the operation amplifier and a ground;

an operating switch for switching a small signal input mode and a large signal input mode; and an on-off control circuit for bringing the switching element into an off state to operate the operation amplifier as a buffer circuit when the operating switch is switched to the large signal input mode, while bringing the switching element into an on state to operate the operation amplifier as an amplifier circuit when the operating switch is switched to the small signal input mode.

2. The pre-amplifier circuit according to claim 1, further comprising
a noise generation preventing circuit for bringing the switching element into an off state when the signal level of an output signal of the operation amplifier is not less than a predetermined level.

3. The pre-amplifier circuit according to claim 2, wherein the noise generation preventing circuit comprises
a voltage divider circuit for dividing an output voltage of the operation amplifier,
a rectifier circuit for rectifying an output of the voltage divider circuit, and
a control element for bringing the switching element into an off state when the output voltage of the rectifier circuit is not less than a predetermined value.

4. A pre-amplifier circuit comprising:
an operation amplifier having a noninverting input terminal connected to a voice input terminal;
a negative feedback circuit having a first resistor which is connected between an output terminal of the operation amplifier and an inverting input terminal of the operation amplifier, and a second resistor and a switching element which are connected in series between the inverting input terminal of the operation amplifier and a ground;
a driving circuit for always bringing the switching element into an on state to operate the operation amplifier as an amplifier circuit; and
an on-off control circuit for bringing the switching element into an off state to operate the operation amplifier as a buffer circuit when the signal level of an output signal of the operation amplifier is not less than a predetermined level.

5. The pre-amplifier circuit according to claim 4, wherein the on-off control circuit comprises
a voltage divider circuit for dividing an output voltage of the operation amplifier,
a rectifier circuit for rectifying an output of the voltage divider circuit, and
a control element for bringing the switching element into an off state when the output voltage of the rectifier circuit is not less than a predetermined value.

* * * * *